United States Patent
Bunce et al.

(10) Patent No.: US 8,299,833 B2
(45) Date of Patent: Oct. 30, 2012

(54) PROGRAMMABLE CONTROL CLOCK CIRCUIT INCLUDING SCAN MODE

(75) Inventors: Paul A. Bunce, Poughkeepsie, NY (US);
Yuen H. Chan, Poughkeepsie, NY (US);
John D. Davis, Maybrook, NY (US);
Richard E. Serton, Clinton, NY (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 12/796,970

(22) Filed: Jun. 9, 2010

(65) Prior Publication Data

US 2011/0304370 A1    Dec. 15, 2011

(51) Int. Cl.
*H03K 3/017*    (2006.01)
(52) U.S. Cl. .......................... 327/172; 327/176; 327/291
(58) Field of Classification Search .......... 327/172–174, 327/176
See application file for complete search history.

(56) References Cited

U.S. PATENT DOCUMENTS

| | | | |
|---|---|---|---|
| 5,274,796 A | 12/1993 | Conner | |
| 5,386,392 A | 1/1995 | Cantiant et al. | |
| 5,444,405 A | 8/1995 | Truong et al. | |
| 5,687,202 A | 11/1997 | Eitrheim | |
| 5,821,793 A * | 10/1998 | Ohta et al. | 327/277 |
| 5,977,809 A | 11/1999 | Wang et al. | |
| 6,538,465 B1 * | 3/2003 | Demone | 326/29 |
| 6,664,833 B1 | 12/2003 | Fischer | |
| 6,687,320 B1 | 2/2004 | Chiu | |
| 6,756,832 B2 | 6/2004 | Reuveni et al. | |
| 6,850,460 B1 | 2/2005 | Chan et al. | |
| 6,959,397 B2 | 10/2005 | Cafaro et al. | |
| 6,977,539 B1 | 12/2005 | McDonagh | |
| 7,151,398 B2 | 12/2006 | Giguere et al. | |
| 7,292,079 B2 | 11/2007 | Huang et al. | |
| 7,459,950 B2 * | 12/2008 | Ngo et al. | 327/172 |
| 7,536,617 B2 | 5/2009 | Jun et al. | |
| 7,616,036 B1 | 11/2009 | Tabatabaei | |
| 7,847,609 B2 * | 12/2010 | Shin | 327/175 |
| 7,936,198 B2 * | 5/2011 | Sautter et al. | 327/291 |
| 2008/0101522 A1 * | 5/2008 | Ngo et al. | 375/372 |
| 2009/0267667 A1 | 10/2009 | Chan et al. | |

OTHER PUBLICATIONS

U.S. Appl. No. 12/109,728, filed on Apr. 25, 2008.
U.S. Appl. No. 12/345,758, filed on Dec. 30, 2008.
U.S. Appl. No. 12/472,510, filed on May 27, 2009.

* cited by examiner

*Primary Examiner* — Hai L Nguyen
(74) *Attorney, Agent, or Firm* — Cantor Colburn LLP; William A. Kinnaman, Jr.

(57) ABSTRACT

A programmable clock control circuit includes a base block configured to control operation of the programmable clock control circuit and a chop block configured to control the width of an output clock signal of the programmable clock control circuit. The circuit also includes a pulse width variation block providing a pulse width variation output to the base block, the base block output being variable to provide at least three different output pulse widths. The circuit also includes a launch clock delay block coupled to delay the output of the base block and a scan clock delay block to delay the output pulse and a selector that causes either the scan clock delay block or the launch clock delay block to be active based on a value of a scan gate signal.

17 Claims, 5 Drawing Sheets

US 8,299,833 B2

PROGRAMMABLE CONTROL CLOCK CIRCUIT INCLUDING SCAN MODE

BACKGROUND

The present invention relates to clock circuits, and more specifically, to clock circuits for arrays.

High performance circuits, such as static random access memory (SRAM) arrays, usually require clock generation circuits to control internal circuit timings. These array local clock generators (also known as Local Clock Buffers, or LCBs) usually are used to control array word decode/bit decode and read/write critical circuit functionality. To provide timing tuning flexibilities as well as hardware debug capabilities, state of the art array LCBs often have programmable controls on their clock delay or pulse width circuits. Multiple discrete timing settings of delay or pulse width are implemented with explicit decoders and with typical inverter delay chains. Such programmability of timing settings of delay or pulse width however adds circuit complexity, chip area and power consumption to the LCB structures. A state of the art local clock control buffer is constructed with modular circuit blocks. This modular topology makes the design extremely flexible to drive different clock loads and latch types.

However, due to the constraints of timing programmability, the ability to shift and delay the launching clock of LCB is limited. For array control designs pulsed clocks are typically needed. Since the pulsed clocks are not changing with frequency, several programmable settings are required to allow for pulse width modulation (PWM) for timing adjustments and for debugging.

SUMMARY

According to one embodiment of the present invention, a programmable clock control circuit is disclosed. The circuit of this embodiment includes a base block configured to control operation of the programmable clock control circuit and coupled to a clock signal and a chop block configured to control the width of an output clock signal of the programmable clock control circuit and having a chop block output. The circuit of this embodiment also includes a pulse width variation block coupled between the chop block and the base block, the pulse width variation block receiving the chop block output and providing a pulse width variation output to the base block, the base block output being variable to provide at least three different output pulse widths. The circuit also includes a launch clock delay block coupled to the output of the base block to delay the output of the base block and having a clock signal output and a scan clock delay block coupled to the output of the base block to delay the output of the base block and having a scan clock output. In addition, the circuit also includes a selector that causes either the scan clock delay block or the launch clock delay block to be active based on a value of a scan gate signal.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments of the present invention are directed to an array clock control circuit structure having significantly more programming features for the pulse width of the launch clock. Embodiments may be built with similar modular topology as the state of the art implementation and reuse as much as possible circuit sub-blocks. Embodiments consist of blocks of circuit elements to provide various clock control function. Included in these blocks are a base block for LCB input control and a launch clock delay (lclk_delay) clock for providing programmable clock delay control. An additional programmable clock delay control circuit uses two mode bits to provide three delay settings. The 2-to-3 decode function is combined with the delay chains. The delay chains are configured with a modulated PFET/NFET inverter structure instead of simple inverter chains. In addition, the circuit may include the capability of switching to a scan mode.

Figure 1:
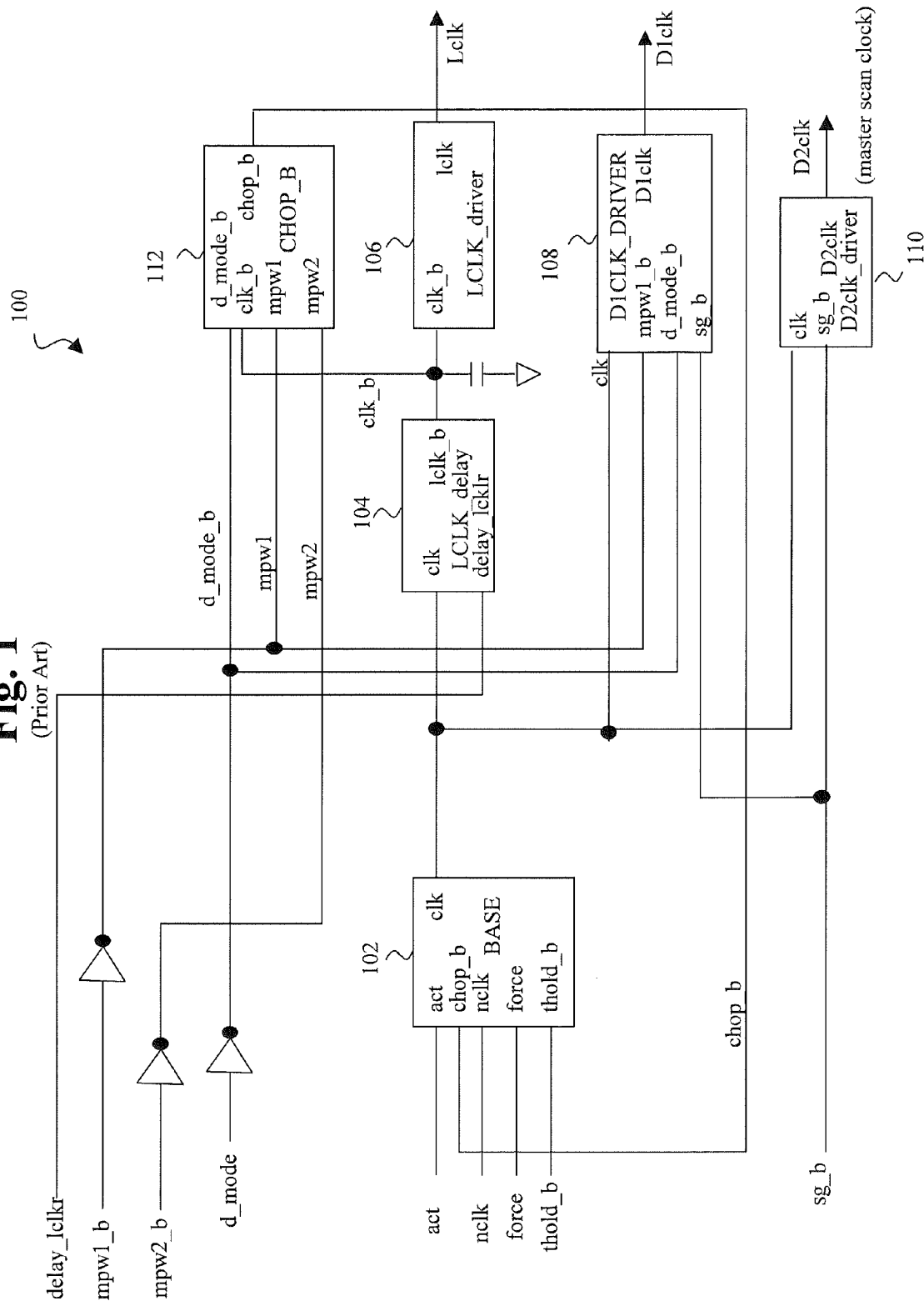
FIG. 1 shows a prior art clock control circuit.

FIG. 1 shows an example of a prior art local control buffer 100. The local clock buffer 100 is constructed with modular circuits as described below. The local clock buffer 100 receives the following input signals: nclk, which is the negative active global clock signal; sg_b or scan gate, which determines the input to a latch of the array and if the latch is available for scanning; act, which is an activate command such that in the functional mode, the local clock is inactive unless activated with "act"; force, which forces a pin override of the act control for scan purposes; and thold_b, which at the thold_b pin is the complement of the test hold signal. The test hold signal is a global gating control and overrides the act and sg pins. The local clock buffer also receives the following signals: d_mode, which is a control to disable pulse mode; mpw1_b and mpw2_b, which vary the clock pulse width for test purposes; and delay_lclkr, which is a control to delay the rising edge of the launch clock (lclk). lclk is the main output of the local clock buffer 100.

The local clock buffer 100 includes base block 102. The base block 102 is the basic/functional control circuitry of the LCB 100. The base block 102 is driven from the negative clock signal (nclk). It has an integrated latch function to capture the act, force, and thold_b signals. The circuitry has a feedback input called "chop_b" that controls the pulsed clock behavior of the output signal "clk."

The LCB 100 also includes a clock delay block 104 that receives the clk signal from the base block 102 and the delay_lclkr signal. The clock delay block 104 provides a delayed clock signal lclk_b to the clock driver 106. This block allows for 1.5 FO4 of delay to the launch clock when the delay signal "delay_lclkr" is active. The clock driver 106 serves as an output driver circuit of the local clock buffer and drives the slave clock load via output signal "lclk".

The LCB 100 also includes a secondary clock block 108 that is coupled to the pulse internal net "clk" and is only active when d_mode_b is high. The control signal mpw1_*b* varies the clock pulse width by ±0.5 FO4 for test purposes. The secondary clock block also receives the control signal sg_b to turn off the master clock in scan mode. It drives the master clock loads via signal "D1clk".

The LCB 100 also includes a third clock driver 110 that accepts control signal sg_b to turn on for scan mode and drives the master clock loads via signal "D2clk".

The LCB 100 also includes a chop_B block 112. This block controls pulse width by sending chop_b signal back to the base block 102. This block also receives signals mpw1, mpw2 to widen or narrow pulse width by ±0.5 FO4 and is only operative when d_mode_b is high.

Figure 2:
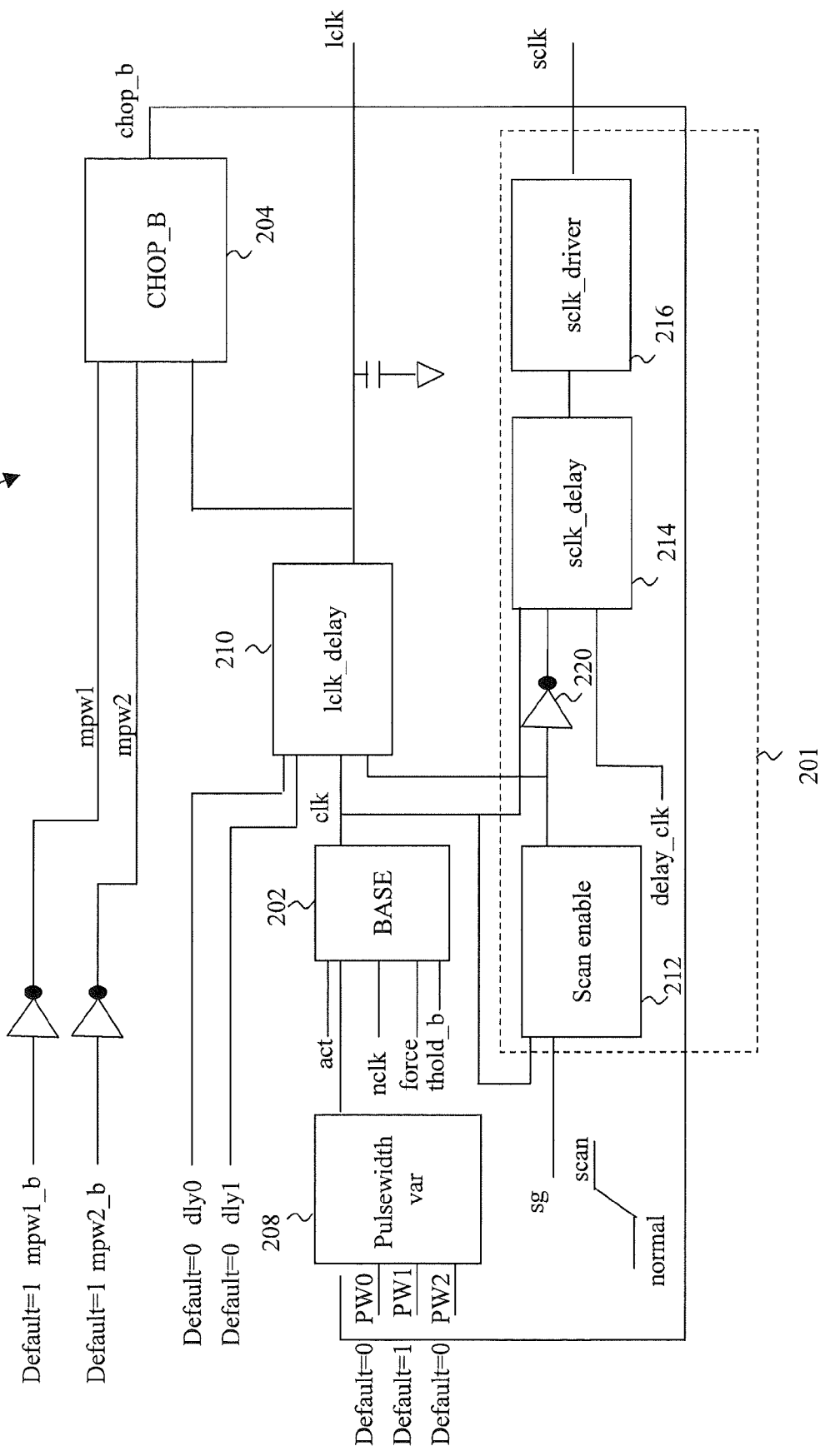
FIG. 2 shows a clock control circuit according to one embodiment of the present invention.

One embodiment of the present invention is shown in FIG. 2. Compared to the prior clock control buffer, the new array clock control circuit structure of the present invention may include more programming features for the pulse width of the launch clock. It also has one additional delay adjustment for the launch clock. It is built with the modular topology similar to the state of the art implementation and reuses many of the prior art circuit sub blocks.

It should be noted that the circuit of FIG. 2 also includes a scan clock creation sub-circuit 201. This sub-circuit may be referred to herein as the scan clock circuit. The scan clock circuit 201 may be formed utilizing many of the same circuit sub blocks as the other portions of the circuit. In this embodiment, the scan clock circuit 201 shares many of the sub blocks with the local clock circuit. This sharing may reduce both power consumption and circuit real estate while providing both a local clock and a scan clock.

In one embodiment, the circuit shown in FIG. 2 may be used to drive SRAM arrays. As discussed above, the circuit includes many standard sub blocks such as, for example, a base block 202 and a chop block (chop_b) 204. In particular, the base block 202 receives an act signal, an nclk signal, a force signal, and a thold_b signal as in the prior art implementation. The base block 202 also receives a signal from a pulse width variation block 208. In general, the base block 202 serves the same function as in the state of the art implementation. This may be advantageous to the overall design methodology because both versions are implemented in the same design environment.

The output of the base block 202 is coupled to a launch clock delay (lclk_delay) block 210. This block provides programmable clock delay control according to an embodiment of the present invention. The lclk_delay block 210 in one embodiment is programmable and includes 3 delay settings. In particular, the lclk_delay block 210 uses 2 mode bits (dly0-dly1) to provide 3 delay settings (default, 1 notch delay, 2 notch delay). The 2-to-3 decode function is combined with the delay chains in the lclk_delay block 210 (as described below). In one embodiment, the delay chains are configured with a modulated PFET/NFET inverter structure instead of simple inverter chains.

The output of the lclk_delay block 210 is coupled to the chop block 204. The output, in one embodiment not shown in FIG. 2, may also be provided to an inverter block to adapt the LCB to a particular clock net. In the event the inverter block is not present, the output of the lclk_delay block 210 (lclk) may be the normal mode operational clock.

The chop block 204 is provided for clock chopper control and controls pulse width by sending a "chop_b" signal back to the pulse width variation block 208. In one embodiment, the chop_b block 204 may accept input signals mpw1 and mpw2 to widen or narrow pulse width by +/−0.5 FO4. In one embodiment, the chop_b block 204 may only be operative when the signal d_mode_b is high and has the same function as in the state of the art implementation.

In addition, the circuit of the present invention may also include a pulse width variation block 208. This block provides for programmable clock pulse width control. It is an expanded pulse width programmability implemented in the clock feedback path with 4 different pulse width settings that are used in conjunction with the existing "chop_b" control block. The four settings are controlled by the input signals, PW0, PW1 and PW2.

Figure 3:
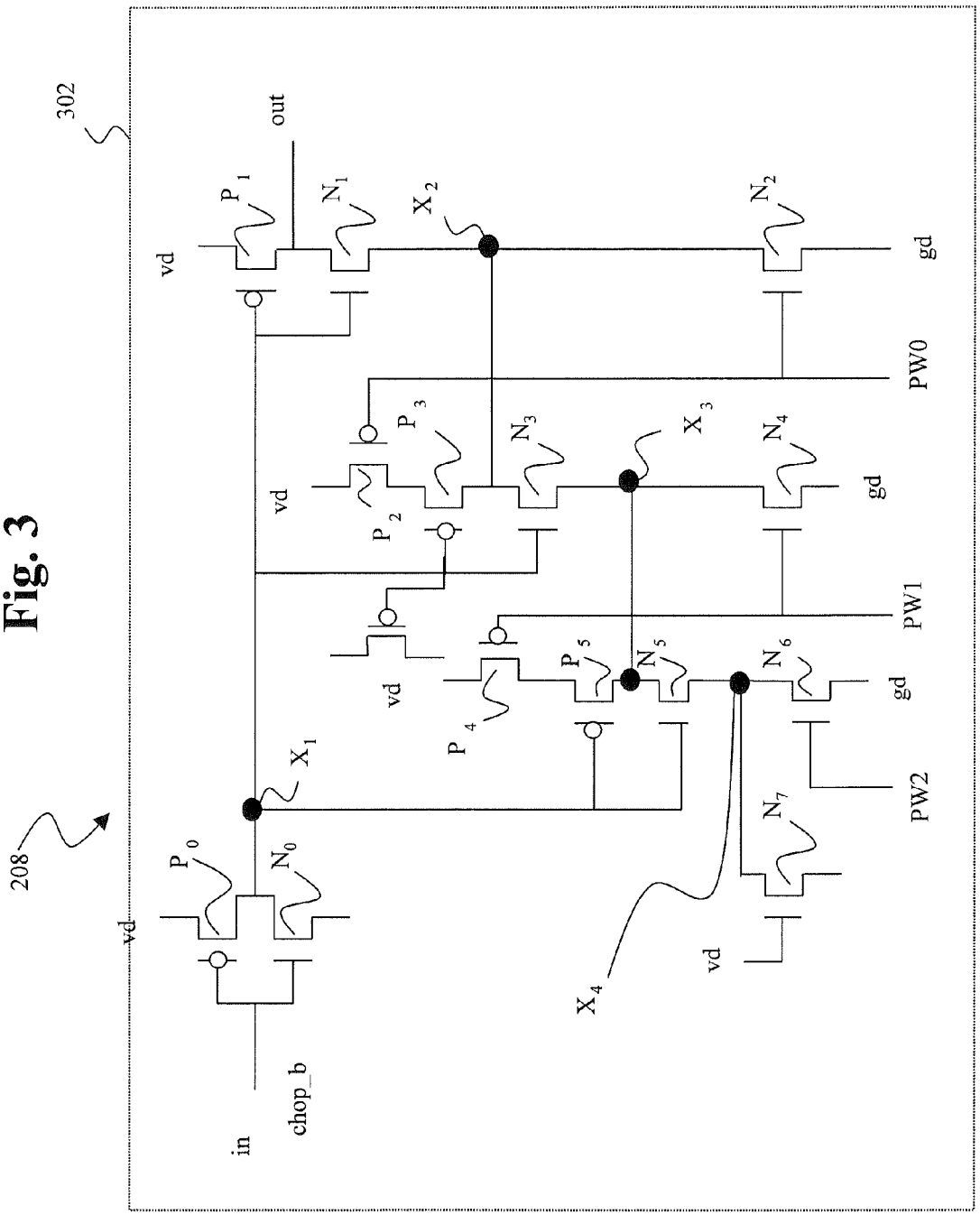
FIG. 3 shows a detailed depiction of one embodiment of a pulse width variation block according to an embodiment of the present invention.

FIG. 3 shows a more detailed depiction of a pulse width variation block 208 according to one embodiment of the present invention. The pulse width variation block 208 includes an NFET stack portion in one embodiment. As such, in this embodiment, the pulse width delay paths are generated mainly with NFET structures. The advantage of using NFET pull down rate for pulse width modulation is that it tracks better with NFET performance in the array critical timing paths. This is due to the memory cell performance being strongly dependent on the NFET pass-gate and in-board pull-down strength, and the fact that most of the critical timing paths in arrays are done using dynamic circuits for performance. These dynamic circuits also have a strong dependence on NFET strength.

In FIG. 3, the program setting determines the number of NFETs in the pulldown stack to ground (gd) therefore, affecting the pulldown rate of signal "out". For example, if the setting is PW0=0, PW1=0, and PW2=0, then, it will pull on the 4 transistors (N1, N3, N5, and N7) in the NFET stack; this generates the widest pulse width. If the setting is PW0=0, PW1=0, and PW2=1, then there would be 5 transistors (N1, N3, N5, N6, and N7) on in the NFET stack to generate awide pulse width. If the setting is PW0=0, PW1=1, and PW2=0, then, there would be 3 NFETs (N1, N3, and N4) on in the NFET stack. The effective NFET device strength increases again. This generates the default pulse width. If the setting is PW0=1, PW1=0, and PW2=0, the, there would be 2 NFETs (N1 and N2) on in the NFET stack. This generates a small pulse width. In short, the NFET stack variation controls the effective pulse width of the output signal "out". In FIG. 3 certain FETs are shown but not described. These FETs are used stabilize input and power supply signals.

Figure 4:
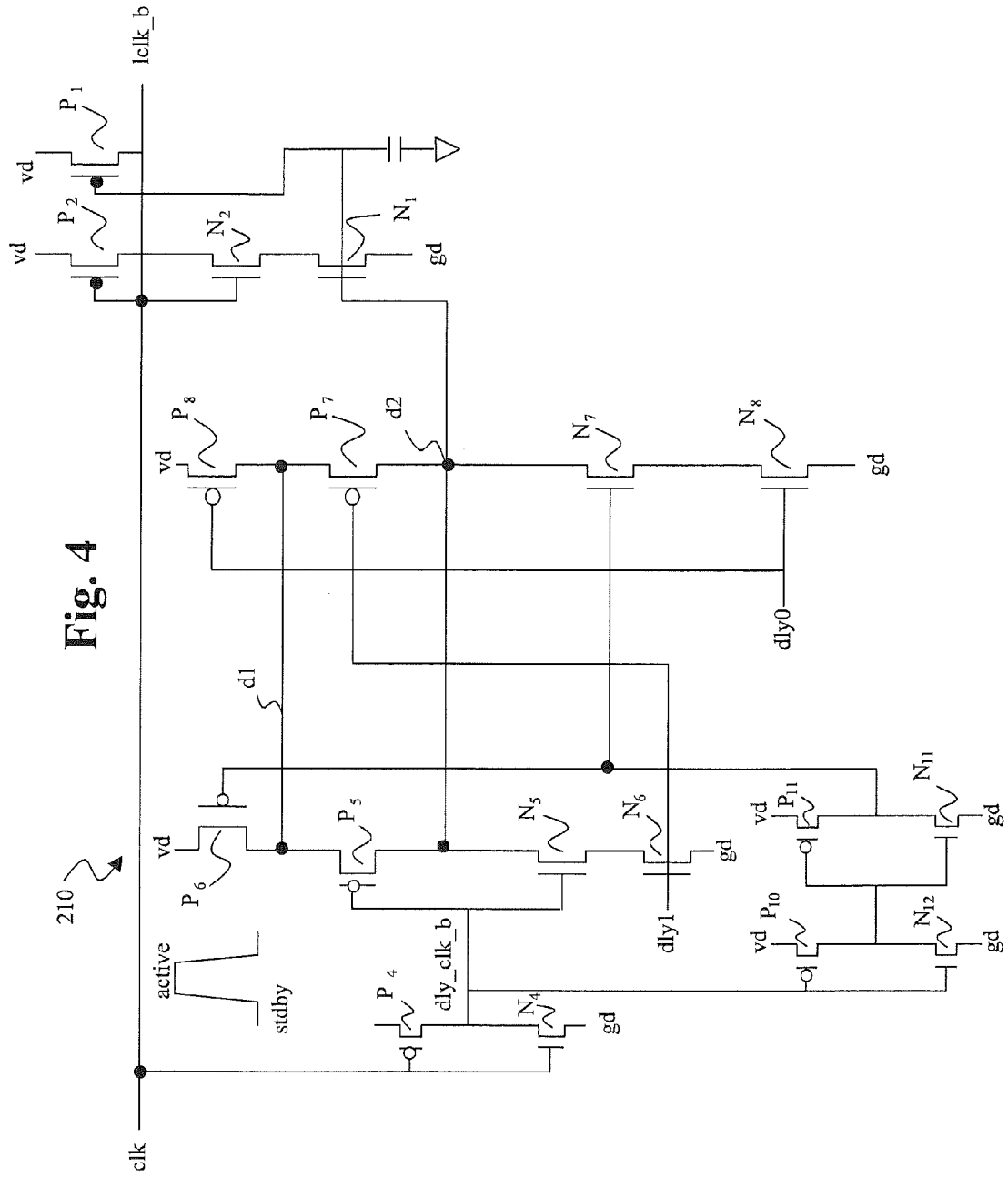
FIG. 4 shows a detailed depiction of one embodiment of a clock delay block according to an embodiment of the present invention.

FIG. 4 shows a more detailed version of an lclk_delay block 210. This block receives the signal clk (from the base block; FIG. 2) and provides an output lclk_b signal. The amount of delay is determined by the control signals dly1 and dly0.

In one embodiment, the lclk_delay block 210 may replace typical delay chains with modulated PFET/NFET inverter structures. The block 210 may include at least three settings based on the input signals dly0 and dly1.

In the event that both dly0 and dly1 are low (nominal setting), both P7 and P8 are DC on, pulling node d2 up to Vd. The 'clk' signal switches thru the upper inverter structure (P2/N2). Hence clock delay is only one inverter long. In the event dly0 is low and dly1 is high (1 notch delay setting) the NFET stack (N5/N6) and the PFET stack (P5/P8) are enabled. Clk switches thru N4 inverter and P5-P8 stack to pull node d2 up. Hence the clock delay is three inverters long (2 stages longer than the default setting). In the event that dly0 is high and dly1 is low, the NFET stack (N7/N8) and the PFET stack (P6/P7) are enabled. Clk switches thru P4/N4 to P10/N10 and P11/N11 inverters, then turns on P6/P7 stack to pull up node d2. Hence the clock delay is five inverters long (2 stages longer than the nominal setting).

Figure 5:
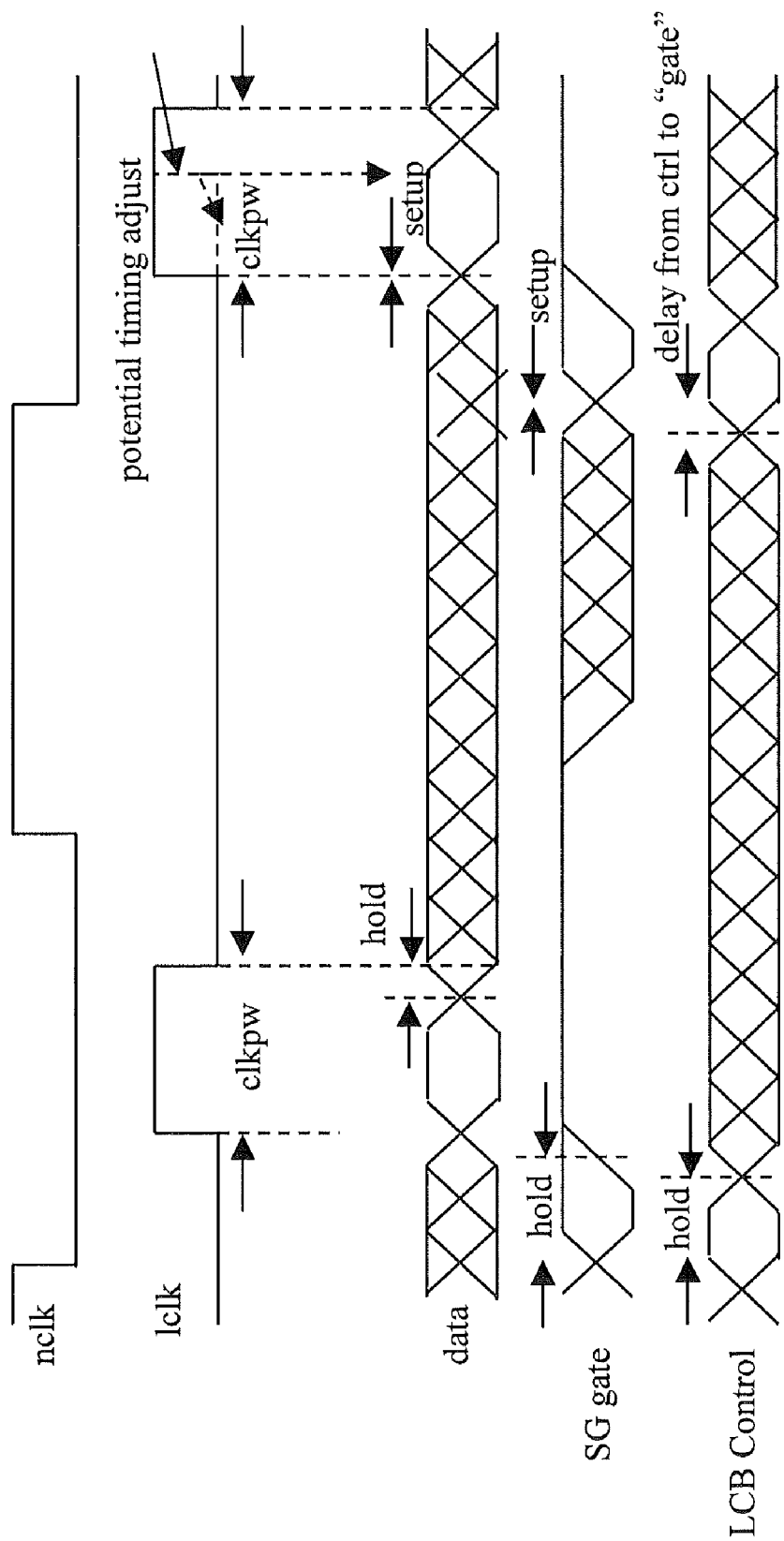
FIG. 5 shows a timing diagram of for the circuit shown in FIG. 2 while in normal operating mode.

FIG. 5 shows a timing diagram for the circuit shown in FIG. 2 while operating in a "normal" mode (as opposed to a scan mode described below). The falling edge of the global clock "nclk" triggers the pulsed clock "lclk". The lclk pulse width is defined with the pulse width variation block but is also triggered from the falling edge of the global clock signal nclk. The array input data have a setup time requirement to the rising edge of the pulsed 'lclk' and have a hold time requirement to the falling edge of the 'lclk'. The LCB control signal's have a setup time requirement to the falling edge of the global clock 'nclk' and hold time requirement to the falling 'nclk'.

The sg gate signal (scan gate signal) which has the same setup and hold time requirements as the LCB control signals. The sg gate input may not be used as in the prior art approach to set the LCB in scan or normal system mode. The sg pin is renamed to 'force' in some embodiments of the present invention. The force pin is a global signal to force the local clock buffer on or off. It overrides the local act control pin for scan purposes.

The advantages of this approach over the state of the art approach are several. They may include, but are not limited to: the launch clock pulse has more programmability to provide a wider pulse width range. This may be essential for array internal timing applications; the launch clock pulse has two delay adjustments for added timing flexibility; the clock control circuit has modular structures as well for the delay lclk and pulse width variation sub block; the new array clock control circuit still has the same basic function as the state of the art design. This may allow for common chip design flow.

Referring again to FIG. 2, as discussed above, the sg pin (force) of the base block 20 may not be utilized as it was in the prior art. Rather, in one embodiment, scanning may be implemented by utilizing the scan clock circuit 201 and disabling the lclk_delay block 210.

The scan clock circuit 201 includes a scan enable block or selector 212. The scan enable block 212 is coupled to the output of the base block 202 and a scan enable signal. The scan enable signal may come from another circuit and indicate when a clock should be transferred into a scan mode. The scan enable block 212 may operate, and be implemented as, a clocked inverter with the output (clk) of the base block 202 serving as the clock. The output of the scan enable block 212 is provided to inverter 220. Opposing sides of the inverter are coupled to the lclk_delay block 210 and a scan clock delay (sclk_delay) block 214. These two different signals (based on the output of scan enable block 212) cause either the lclk_delay block 210 or the scan clock delay block 214 to be enabled. In the event the lclk_delay block 210 is enabled, the circuit operates as described above.

It shall be understood that scan enable block 212 may be omitted. In general, the scan enable block 212 may be utilized to ensure that a change in the value of the signal sg only changes the operation of the circuit 200 when the signal clk is active. This may help ensure that the signal sg does not introduce circuit changes at an inappropriate time in the clock cycle.

The scan clock delay block 214 is coupled to the intermediate clock signal clk. This signal, however, follows the system clock (nclk) when in scan mode. This is because, in scan mode, lclk_delay block 210 is disabled. This, in turn, causes chop_b block 204 to be disabled and, effectively, turns off pulse width variation block 208. Without pulse width variation block 208 being active, base block 202 passes the system clock (nclk) as the intermediate clock signal lck.

The sclk_delay block 214 may be couple to a system wide delay input delay_lclk that allows for the system clock to be delayed, if necessary, to match actual operation conditions. In one embodiment, the output of the scan clock delay block 214 is provided to an sclk_driver circuit 216 to enable the scan signal to be driven to multiple arrays.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A programmable clock control circuit, the circuit comprising:
   a base block configured to control operation of the programmable clock control circuit, the base block being coupled to a clock signal and having an output;
   a chop block configured to control the width of an output clock signal of the programmable clock control circuit and having a chop block output;
   a pulse width variation block coupled between the chop block and the base block, the pulse width variation block receiving the chop block output and providing a pulse width variation output to the base block, the base block output being variable to provide at least three different output pulse widths;
   a launch clock delay block coupled to the output of the base block to delay the output of the base block and having a clock signal output;
   a scan clock delay block coupled to the output of the base block to delay the output of the base block and having a scan clock output; and a selector that causes either the scan clock delay block or the launch clock delay block to be active based on a value of a scan gate signal.

2. The circuit of claim 1, wherein the pulse width variation block includes three control inputs.

3. The circuit of claim 2, wherein the control inputs control the operation of the pulse width variation block to alter the chop block output.

4. The circuit of claim 2, wherein the pulse width variation block comprises:
an NFET stack coupled to the three control inputs.

5. The circuit of claim 4, wherein each control input is coupled, at least in part, to the NFET stack through an NFET.

6. The circuit of claim 1, wherein the launch clock delay block includes at least three different delay settings.

7. The circuit of claim 6, wherein the launch clock delay block includes a plurality of delay structures.

8. The circuit of claim 6, wherein the launch clock delay block includes two delay control inputs.

9. The circuit of claim 8, wherein in the event that a first of the delay control inputs is low and the second of the delay control inputs is low, a first delay structure delays the output pulse a first delay amount.

10. The circuit of claim 9, wherein in the event that a first of the delay control inputs is low and the second of the delay control inputs is high, the first delay structure and a second delay structure delay the output pulse a second delay amount greater than the first delay amount.

11. The circuit of claim 10, wherein in the event that a first of the delay control inputs is high, the first delay structure, the second delay structure delay and a third delay structure delay the output pulse a third delay amount greater than the second delay amount.

12. The circuit of claim 11, wherein the first delay structure includes one inverter, the second delay structure includes three inverters and the third delay structure includes five inverters.

13. The circuit of claim 12, wherein one or more of the inverters are formed by an NFET/PFET pair.

14. The circuit of claim 1, wherein the selector comprises an inverter.

15. The circuit of claim 14, wherein the selector is couple to an output of a clocked inverter that only passes the scan gate signal when the output of the base block is active.

16. The circuit of claim 14, wherein in the event that the scan clock delay block is active, the pulse width variation block is inactive.

17. The circuit of claim 16, wherein the chop clock is also inactive and wherein the output of the base block follows the negative clock signal.

* * * * *